United States Patent [19]

Boudry

[11] Patent Number: 5,185,540
[45] Date of Patent: Feb. 9, 1993

[54] ADJUSTABLE TIME CONSTANT CIRCUIT WITH CONSTANT CAPACITANCE AND VARIABLE RESISTANCE

[75] Inventor: Jean-Marie Boudry, Maurepas, France

[73] Assignee: Bull S.A., Paris, France

[21] Appl. No.: 744,951

[22] Filed: Aug. 14, 1991

[30] Foreign Application Priority Data

Aug. 23, 1990 [FR] France ................. 90 10579

[51] Int. Cl.⁵ .................. H03K 5/13; H03K 5/159
[52] U.S. Cl. ............................ 307/603; 307/591; 307/605; 307/242
[58] Field of Search ........... 307/591, 601, 602, 603, 307/605, 242, 571, 575, 606

[56] References Cited

U.S. PATENT DOCUMENTS

| | | | |
|---|---|---|---|
| 3,737,683 | 6/1973 | Sangster | 307/591 |
| 5,028,824 | 7/1991 | Young | 307/601 |
| 5,030,861 | 7/1991 | Hoffman et al. | 307/571 |

FOREIGN PATENT DOCUMENTS

| | | |
|---|---|---|
| 3636757 | 10/1986 | Fed. Rep. of Germany . |
| 61-52022 | 7/1986 | Japan . |
| WO88/08642 | 11/1988 | PCT Int'l Appl. . |

Primary Examiner—William L. Sikes
Assistant Examiner—Toan Tran
Attorney, Agent, or Firm—Weingarten, Schurgin, Gagnebin & Hayes

[57] ABSTRACT

A time constant circuit for regulating the phases of clock signals of a synchronous system includes a plurality of transfer gates composed of MOS-type transistors whose drain-source leads constitute resistance elements. The time constant is adjusted by selectively activating transfer gates, the capacitance of the circuit being the total structural capacitance of the MOS transistors. To ensure that the capacitance remains constant, each transfer gate is associated with an auxiliary compensating circuit which, when activated, introduces a capacitance of the same value as the capacitance of the gate in the conducting state. The invention likewise relates to a variable-delay circuit using the time constant circuit.

11 Claims, 1 Drawing Sheet

ADJUSTABLE TIME CONSTANT CIRCUIT WITH CONSTANT CAPACITANCE AND VARIABLE RESISTANCE

FIELD OF THE INVENTION

This invention relates to a time constant circuit whose characteristics can be modified as a function of an adjusting value and to a variable-delay circuit utilizing a time constant circuit of this kind.

BACKGROUND OF THE INVENTION

Time constant and variable-delay circuits have many applications, one of the most important being adjustment of the phase of a clock signal used in a complex synchronous system. This phase adjustment is intended to compensate for differences in synchronization that can be caused by electrical connections and especially by manufacturing differences. It is desirable for these parasitic delays, usually called "skew", to be corrected. Known delay circuits often use a dynamic phase lock loop, making them dependent on the clock frequency and ruling out their use for step-by-step operation. It is therefore appropriate to seek a solution among static operating circuits. They can be made from an RC type circuit where the resistance R ca be modified by control signals as a function of an adjusting value.

In addition, in the case of an embodiment in an integrated circuit, it is preferable for the adjusting value to be defined digitally to avoid problems related to technological variations. For this purpose, the circuit advantageously can consist of an RC circuit whose resistance R is composed of a plurality of elementary resistances selectively connected in parallel as a function of a digital control command.

On the other hand, the circuit is preferably designed to allow its easy integration into an integrated circuit employing MOS or CMOS technology or, more generally, one based on isolated-gate field effect transistors (IGFETs). In this context, the easiest way to obtain controlled resistance is to employ the drain-source lead of an MOS transistor, whose size governs the value of the resistance. The resistance can be included in the circuit in simple fashion by applying a control signal of the appropriate polarity to the transistor gate. Thus each MOS transistor fulfills the dual function of a switch and a resistor. Of course, a functionally equivalent embodiment could consist of replacing this transistor by a plurality of transistors of the same and/or complementary type, provided that in the latter case control signals of the correct polarity are applied to their gates. For example, a circuit called a "transfer gate" can be used, which consists of an NMOS transistor in parallel with a PMOS transistor, with their gates receiving control signals of opposite polarities.

Moreover, isolated gate transistors in the conducting state exhibit high capacitance between their gates and each of their other electrodes. Of course, an MOS transistor wired as a switch or a CMOS transfer gate constitutes an RC circuit. It is therefore a good idea to take advantage of this property by devising a time constant circuit composed primarily of MOS switches or CMOS transfer gates, with the capacitance C of the RC circuit then being the structural capacitance of the unit.

To adjust the time constant accurately, it must be possible to insert a high-value resistor selectively in parallel. In practice, the resistance of the drain-source lead of an MOS transistor is adjusted by varying the "width" of the transistor. Thus, in order to increase the resistance of the transistor, its width must be reduced. Since its length is essentially fixed for a given technology, the gate-drain or gate-source capacitances of the transistor will be reduced. On the other hand, the capacitive effect of the transistor is practically nonexistent except when it is conducting. It follows from the above that increasing the resistance of a transistor reduces the total capacitance of the circuit; this is the opposite of the desired effect, which is to increase the time constant. Consequently, in order to have a strong time constant, the resistance of the transistor must be increased to a much greater degree but its width must be reduced, rapidly leading to the lower limit imposed by the technology.

In addition, the maximum time constant is obtained when the transistor with the highest resistance is the only one that conducts. Because the other transistors are blocked, their contribution to the resultant capacitance of the circuit is practically zero.

SUMMARY OF THE INVENTION

A circuit with an adjustable time constant is provided that includes a plurality of transfer gates whose outputs are connected together, the transfer gates being selectively activated by control signals as a function of an adjusting value, wherein each transfer gate includes at least one isolated gate field effect transistor whose drain-source lead constitutes the resistance element of the gate and whose gate receives one of the control signals. Also, each transfer gate is associated with an auxiliary compensating circuit which, when activated, introduces a capacitance of the same value as the capacitance of the gate in the conducting state. Thus, the resultant capacitance is made practically independent of whether the transistors that act as resistors do or do not conduct. Each transfer gate also includes control means for activating the auxiliary circuit when the associated gate is deactivated and vice versa.

In the case of an embodiment in the form of an integrated circuit, it should be noted that the actual characteristics of a transistor of a given size can differ considerably from one circuit to another due to variations in technology. On the other hand, differences in a given integrated circuit between transistors of the same size are very small. In addition, the best compensating effect is obtained by employing an auxiliary circuit whose composition and size are identical to the transfer gate with which it is associated.

The circuit of the invention provides an adjustable delay independent of the frequency of the clock signal to be corrected, and in particular, allows step-by-step clock operation. The invention also provides an embodiment that can be readily implemented in MOS or CMOS technology.

The invention also facilitates precise adjustment of the time constant over as broad a range of values as possible without complicating the required command.

Furthermore, in preferred embodiments, the circuit according to the invention is characterized by a plurality of transfer gates being so dimensioned that they introduce resistance values, all of which are different and proportional to a power of two, by the adjusting value being defined by a binary number, and by each bit of the binary number defining the control signal of an associated transfer gate.

Generally, for a given application, the time constant must not exceed a given value. For this reason, and in accordance with another aspect of the invention, one of the transfer gates is permanently activated and dimensioned to introduce a resistance that defines predetermined maximum time constant for the circuit.

The invention also provides a delay circuit for delaying an input signal as a function of an adjusting value, the delay circuit using the time constant circuit described above. For this purpose it is sufficient to connect the output of the time constant circuit according to the invention to the input of an amplifier with a given trigger threshold.

Typically, to delay a signal such as a clock signal, the rising and descending slopes of this signal must be delayed by the same amount. Now, regardless of the technology employed, and especially in CMOS technology, the circuits can behave differently depending on whether they are acting on the rising or descending slope of the input signal.

To solve this problem, the delay circuit according to the invention is therefore characterized by the input signal being applied to the transfer gates of a first time constant circuit through a first CMOS inverter, and by the outputs of the transfer gates of the first circuit being connected to the inputs of the transfer gates of a second time constant circuit, identical to the first, through a second CMOS inverter.

In the above circuit, each resistance is not defined solely by the drain-source resistances of the transfer gates, because each resistance is also dependent upon the drain-source resistances of the transistors constituting the inverters connected on the supply side. To provide a range of adjustments that is both accurate and extensive, especially by using a binary resistance scale, the resistance introduced by each inverter should be proportional to that of the transistors of the associated transfer gate. For this purpose, all the transistors are dimensioned identically or proportionally.

DESCRIPTION OF THE DRAWING

The invention will be more fully understood from the following detailed description, in conjunction with the accompanying figures, in which.

DETAILED DESCRIPTION OF THE INVENTION

Figure 1:
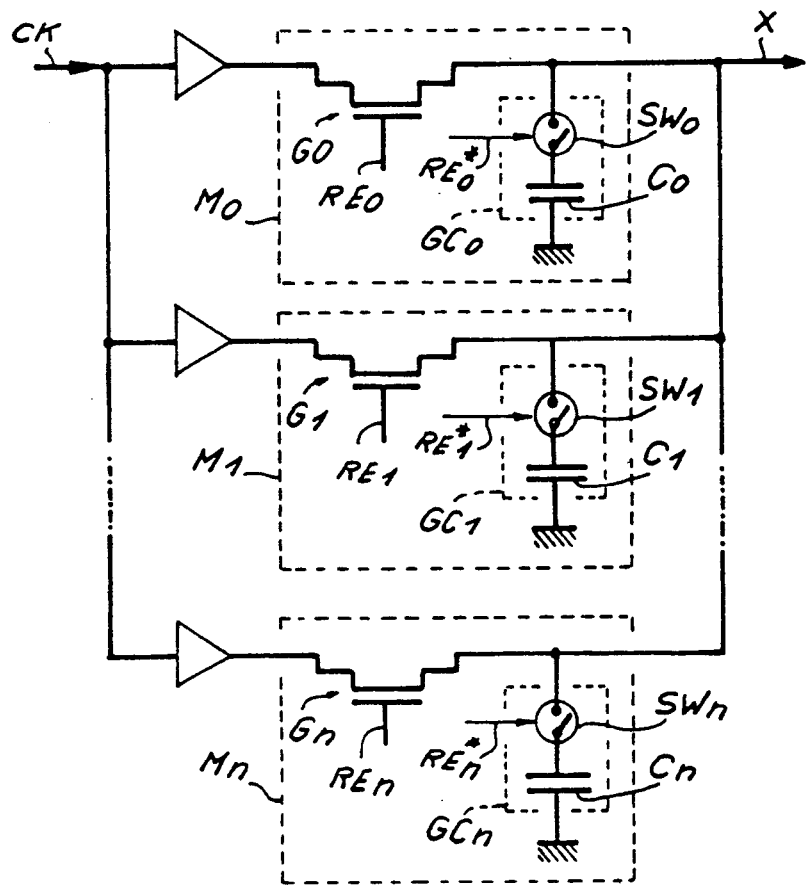
FIG. 1 shows the adjustable time constant circuit according to the invention in its most general form.

With reference to FIG. 1, the time constant circuit 10 includes a plurality of modules M0, M1, ..., Mn. Each module, for example M0, comprises a switch, here composed of an NMOS transistor G0 controlled by the RE0 signal applied to its gate. One of the main electrodes (drain or source) of the transistor G0 receives input signal CK through an amplifier 12, with the third electrode being connected to output terminal X of the circuit 10.

The module M0 also comprises a compensating circuit GC0 composed of a switch SW0 in series with compensating capacitor C0. The circuit GC0 is connected between output X and a point with a fixed potential, for example ground 18. Switch SW0 is controlled by signal RE*0 complementary to RE0.

The transistors G0, G1, ..., Gn have widths that are sized to introduce a particular resistance between the output of the amplifier 12 and output X of the circuit 10. Each of these transistors, with its capacitance between its gate and output X, contributes to the resultant capacitance of the circuit 10, and capacitances C0, C1, ..., Cn of compensating circuits GC0, GC1, ..., GCn are sized to have the same values as the capacitances of the associated transistors.

The circuit 10 operates as follows. Since the adjusting value is defined by a binary number composed of n bits, each bit of this number (bit 1 for example) imposes the polarity of an associated control signal, for example RE1. If this bit is equal to 1, RE1 is positive and RE1 is 0. Transistor G1 therefore conducts and switch SW1 is open. The contribution of transistor G1 to the resultant capacitance is therefore equal to the capacitance between the gate and output X of transistor G1 in the ON state. If on the other hand the bit is 0, transistor G1 is blocked and its capacitance is therefore negligible. On the other hand, when switch SW1 is closed, capacitance C1 contributes to the resultant capacitance.

Advantageously, the resistances of transistors G0 to Gn are proportional to a power of 2 so as to cover accurately an extensive range of adjustments. In one embodiment, a specific module can be provided whose transistor is permanently set to conduct (the gate is wired to a positive supply terminal) and dimensioned to define a predetermined maximum value of the time constant.

The circuit 10 could be the subject of numerous variations to form switches G0 to Gn and compensating circuits GC0 to GCn. Thus, each transistor G0 could be replaced by a plurality of transistors connected in parallel, regardless of whether they are of the same type or of complementary types in the case of CMOS technology. On the other hand, each compensating circuit, for example GC0, can consist of one or a plurality of MOS transistors connected and dimensioned identically to associated switch G0. In this case the main equivalent electrodes of the transistors in circuit GC0 would all be connected to output X while the other main electrodes would be connected to one another. The gates of these transistors therefore receive signals complementary to those supplied to the gates of the transistors of the same type in the corresponding switch.

Figure 2:
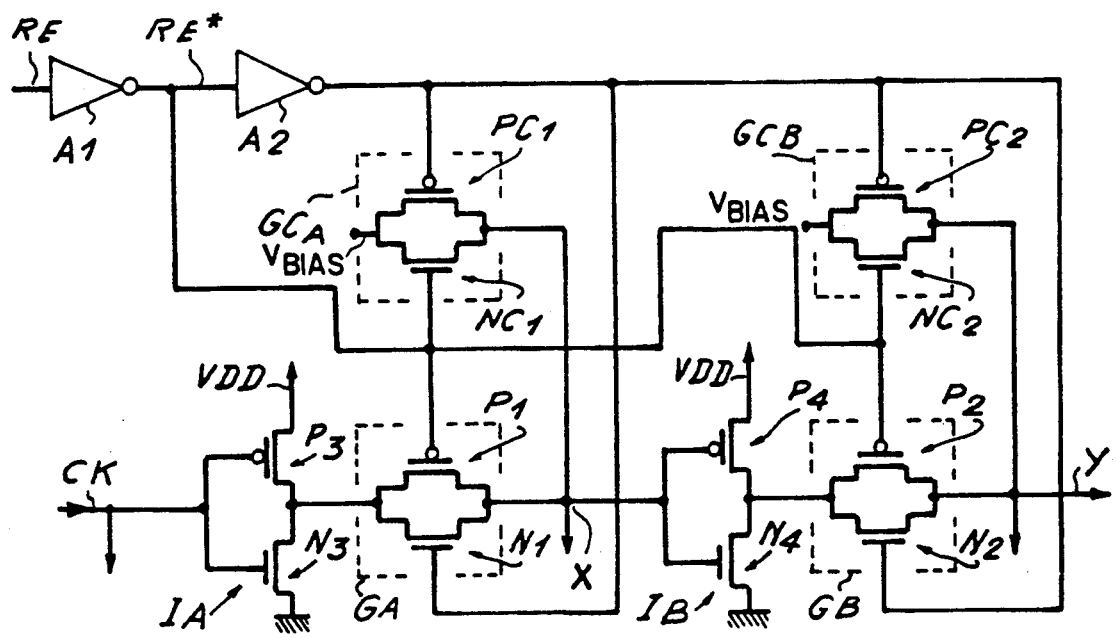
FIG. 2 shows a CMOS implementation of an adjustable delay circuit using the time constant circuit according to the invention.

FIG. 2 illustrates in greater detail an embodiment using CMOS technology in the form of a delay circuit that consists of a plurality of modules 24. Each module 24 is controlled by an associated control signal RE analogous to one of the commands RE0 to REn defined above and shown in FIG. 1. Each module 24 comprises a first and a second switch GA, GB associated respectively with a first and a second compensating circuit GCA, GCB. GA and GCA together form a first time constant circuit, and GB and GCB together form a second time constant circuit.

In the remainder of this specification, the letters N and P will represent the MOS transistors with N and P channels, respectively. Switch GA consists of a CMOS transfer gate composed of complementary transistors N1 and P1 connected in parallel. One of the main electrodes of each of these transistors is connected to the output of a CMOS inverter IA composed of complementary transistors P3 and N3. The other main electrodes of transistors N1 and P1 are connected at a common point X to all the delay circuit modules. Compensating circuit GCA of gate GA is likewise composed of a CMOS transfer gate whose complementary transistors NC1 and PC1 are identical in size to those of transistors N1 and P1, respectively. The output gate of GCA is connected to the point X.

Similarly, the elements of the second time constant circuit associated with the module shown are transfer gates GB and GCB, respectively identical to gates GA and GCA. The outputs of gates GB and GCB are likewise connected together to the output Y of the delay circuit. The signal CK to be delayed is applied to the input of CMOS inverter IA. Output X of the first time constant circuit is fed to the input of transfer gate GB of each module through a second CMOS inverter IB composed of transistors P4 and N4.

Control signal RE is applied to the input of an inverter A1 whose output RE* is connected to the gates of transistors NC1, P1, NC2, and P2. Output RE* is connected to the input of a second inverter A2 whose output is connected to the gates of transistors PC1, N1, PC2, and N2.

The circuit in FIG. 2 operates as follows. When the module is selected, control signal RE is at logic value 1 and transistors NC1, PC1, NC2 and PC2 are blocked while transistors P1, N1, P2, and N2 can conduct. Conversely, if the module has not been selected signal RE is at logic value 0, its complement RE* is at logic value 1 and transistors PC1, NC1, PC2 and NC2 conduct while transistors P1, N1, P2 and N2 are blocked. Thus, the resultant capacitance of two time constant circuits remains constant regardless of the modules selected.

The contribution of one of the selected modules to the characteristics of the first time constant circuit depends for example not only on the sizes of transistors P1 and N1 of the transfer gates but also on the sizes of transistors P3, N3, and P4, N4 of the inverters on the supply and consumer sides. The time constant therefore depends not only on the drain-source resistances of transistors P1 and N1, but also on the drain-source resistances of transistor P3 or N3 of inverter IA, depending on the polarity of input signal CK. Similarly, the capacitance depends on transistors P1 and N1, but also on the capacitance of transistor N4 or P4, depending on the polarity of voltage X. Now, the characteristics of MOS P-type transistors can differ from those of N-type transistors depending on the manufacturing method employed. This indicates the significance of the proposed circuit, using two identical time constant circuits wired in series through an inverter, because the treatments to which the rising edges of the input signal are subjected are then identical to those to which the falling edges are subjected, it being understood that output Y is itself normally applied to the input of a third inverter, not shown.

Finally, since the resistances introduced by the modules of each time constant circuit are advantageously proportional to one another (for example, according to a power of 2), it is useful for this purpose to dimension the transistors of each inverter to present resistance proportional to that of the transfer gate which they supply. One particularly simple solution consists in selecting the same dimensions for all of the NMOS transistors and another compatible size for all of the PMOS transistors in the same module.

Other modifications and implementations will occur to those skilled in the art without departing from the spirit and the scope of the invention as claimed. Accordingly, the above description is not intended to limit the invention except as indicated in the following claims.

What is claimed is:

1. An adjustable time constant circuit comprising:
   a plurality of transfer gates, each of said transfer gates having an input port and an output port wherein each of said output ports are connected to one another and wherein each of said input ports are coupled to an input signal line with each of said transfer gates being selectively activated by control signals which are a function of an adjusting value, and wherein each transfer gate comprises:
   at least one isolated gate field effect transistor whose drain-source lead provides a resistance element of said transfer gate and whose gate receives one of said control signals;
   a like plurality of compensating auxiliary circuits with each of said compensating auxiliary circuits coupled to the output port of a corresponding one of said plurality of transfer gates and wherein each of said plurality of compensating auxiliary circuits provides, when activated, a capacitance of the same value as a capacitance between said gate of said field effect transistor and said transfer gate output port when said transfer gate is placed in the conducting state; and
   control means coupled to each of said plurality of compensating auxiliary circuits to activate said plurality of compensating auxiliary circuits when the corresponding transfer gate is deactivated, and vice versa.

2. The time constant circuit of claim 1 characterized by each transfer gate including MOS transistors and by each of said plurality of compensating auxiliary circuits being provided as a transfer gate including MOS transistors identical in size to that of the corresponding transfer gate, by an output of the compensating auxiliary circuit transfer gate being connected to the output port of the corresponding transfer gate, and by said control means supplying to the gates of the transistors of the compensating auxiliary circuit transfer gate and the corresponding transfer gate, respectively, with complementary control signals.

3. The time constant circuit of claim 1 characterized by a plurality of said transfer gates being dimensioned to introduce resistance values that are all different and proportional to a power of 2, by said adjusting value being defined by a binary number, and by each bit of the binary number defining a control signal of a corresponding transfer gate.

4. The time constant circuit of claim 1 characterized by one of the transfer gates being activated permanently and dimensioned so as to introduce a resistance value that defines a predetermined maximum value of the time constant of the circuit.

5. The time constant circuit of claim 1 characterized by each transfer gate being a CMOS gate comprising an equal number of P-type transistors and N-type transistors, with the drain-source leads of said complementary transistors being connected in parallel.

6. An adjustable delay circuit, to delay an input signal as a function of an adjusting value, comprising:
   at least two adjustable time constant circuits each of said time constant circuits comprising:
   a plurality of transfer gates each of said transfer gates having an input port and an output port wherein each of the output ports are connected to one another, said transfer gates being selectively activated by a control signal which is a function of an adjusting value; and wherein each transfer gate comprises:

at least one isolated gate field effect transistor having drain, source and gate electrodes wherein a drain-source signal path provides a resistance element of said transfer gate and the gate electrode receives one of said control signals;

a like plurality of compensating auxiliary circuits with each of said compensating auxiliary circuits coupled to a corresponding one of the output ports of said plurality of transfer gates and wherein each of said plurality of compensating auxiliary circuits provides, when activated, a capacitance of the same value as a capacitance between said gate electrode and the output port of said transfer gate when said transfer gate is placed in the conducting state;

control means coupled to each of said compensating auxiliary circuits for activating said auxiliary circuit when the corresponding gate is deactivated, and vice versa; and wherein an input signal is fed to a first transfer gate of a first one of the at least two time constant circuits through a first CMOS inverter and the outputs of the plurality of transfer gates of said first time constant circuit is connected to the input of a second transfer gate of a second one of said at least two time constant circuits through a second CMOS inverter.

7. The adjustable delay circuit of claim 6 characterized by each transfer gate being implemented using CMOS technology, by the input port of each transfer gate being connected to an output of a corresponding CMOS inverter, and by the P- and N-channel transistors respectively of the CMOS inverters having sizes proportional or identical to those of the corresponding transfer gates.

8. An adjustable time constant circuit having an input port and an output port, comprising:

a plurality of transfer gates with each of said transfer gates having an input port and an output port and with each of said input ports being coupled to the input port of said adjustable time constant circuit and each of said output ports being coupled to the output port of said adjustable time constant circuit;

a like plurality of compensating auxiliary circuits with each of said compensating auxiliary circuits having a first port coupled to a corresponding one of the output ports of said plurality of transfer gates each of said compensating auxiliary circuits for providing a capacitance at the corresponding output port of said transfer gate wherein said capacitance has the same value as a capacitance at the output port of said transfer gate when said transfer gate is placed in a conducting state; and a control circuit coupled to each of said compensating auxiliary circuits and to each of said transfer gates, for activating a corresponding one of said compensating auxiliary circuits and for substantially simultaneously deactivating the corresponding transfer gate.

9. The adjustable time constant circuit of claim 8 wherein each of said transfer gates comprises at least one isolated gate field effect transistor having a gate electrode, a source electrode and a drain electrode with said gate electrode coupled to a reference potential and with a first one of said source and drain electrodes coupled to the input port of said transfer gate and a second one of said source and drain electrodes coupled to the output port of said transfer gate.

10. The adjustable time constant circuit of claim 9 wherein each of said compensating auxiliary circuits comprises:

a single pole single throw switch having a first port coupled to the output port of said transfer gate and a second port; and a capacitor having a first electrode coupled to the second port of said single pole single throw switch and a second electrode coupled to a first reference potential.

11. The adjustable time constant circuit of claim 10 wherein:

each of said plurality of gate electrodes are coupled to a first end of a control line with a second end of said control line being coupled to said control circuit, said control circuit providing to each of said gate electrodes, through said control line, at least one control signal which selectively activates a corresponding one of said transfer gates and wherein each of the at least one control signals are a function of an adjusting value;

a drain-source signal path of the at least one isolated gate field effect transistors provides a resistance element of said transfer gate; and each of said plurality of compensating auxiliary circuits provides, when activated, a capacitance corresponding to a capacitance between said gate electrode of said at least one isolated gate field effect transistor and said output port of said transfer gate when said isolated gate field effect transistor is placed in its conducting state.

* * * * *

UNITED STATES PATENT AND TRADEMARK OFFICE
CERTIFICATE OF CORRECTION

PATENT NO. : 5,185,540
DATED : February 9, 1993
INVENTOR(S) : Jean-Marie Boudry

It is certified that error appears in the above-identified patent and that said Letters Patent is hereby corrected as shown below:

Column 1, line 26, "R ca" should read --R can--.

Signed and Sealed this

Fifteenth Day of March, 1994

Attest:

BRUCE LEHMAN

Attesting Officer        Commissioner of Patents and Trademarks